US012224354B2

(12) United States Patent
Ding et al.

(10) Patent No.: US 12,224,354 B2
(45) Date of Patent: Feb. 11, 2025

(54) OXIDE THIN FILM TRANSISTOR, DISPLAY PANEL AND PREPARATION METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Ding Ding, Hubei (CN); Liang Fang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 501 days.

(21) Appl. No.: 17/597,027

(22) PCT Filed: Dec. 6, 2021

(86) PCT No.: PCT/CN2021/135599
§ 371 (c)(1),
(2) Date: Dec. 22, 2021

(87) PCT Pub. No.: WO2023/087419
PCT Pub. Date: May 25, 2023

(65) Prior Publication Data
US 2023/0155031 A1 May 18, 2023

(30) Foreign Application Priority Data
Nov. 18, 2021 (CN) .......................... 202111367137.7

(51) Int. Cl.
H01L 27/12 (2006.01)
H01L 29/08 (2006.01)
H01L 29/786 (2006.01)

(52) U.S. Cl.
CPC ...... *H01L 29/7869* (2013.01); *H01L 27/1225* (2013.01); *H01L 27/127* (2013.01); *H01L 29/0847* (2013.01); *H01L 29/78696* (2013.01)

(58) Field of Classification Search
CPC .............. H01L 29/7869; H01L 29/786; H01L 29/0847; H01L 29/08; H01L 29/1079;
(Continued)

(56) References Cited

U.S. PATENT DOCUMENTS 6,429,485 B1    8/2002  Ha et al.
11,456,386 B2 *  9/2022  Bai ................ H01L 29/78696
(Continued)

FOREIGN PATENT DOCUMENTS

CN    106711087 A    5/2017
CN    107623040 A    1/2018
(Continued)

OTHER PUBLICATIONS

International Search Report in International application PCT/CN2021/135599, mailed on Aug. 1, 2022, with English translation.
(Continued)

*Primary Examiner* — Nikolay K Yushin
(74) *Attorney, Agent, or Firm* — HSML P. C.

(57) ABSTRACT

The present application discloses an oxide thin film transistor, a display panel, and a preparation method thereof. Each thickness of the first gate insulating layer of the present application corresponding to the first source doped region, the first drain doped region, the first diffusion region, and the second diffusion region is less than a thickness corresponding to the first channel region; and thicknesses of the first
(Continued)

gate insulating layer corresponding to the first diffusion region and the second diffusion region are both different from a thickness corresponding to the first source doped region and the first drain doped region. The the first gate insulating layer effectively shields the first channel region laterally.

19 Claims, 7 Drawing Sheets

(58) Field of Classification Search
CPC ......... H01L 29/78618; H01L 29/78696; H01L 29/4908; H01L 29/49; H01L 29/78621; H01L 29/78645; H01L 27/1225; H01L 27/12; H01L 27/127; H01L 29/0653; H01L 29/7833; H01L 29/78612
See application file for complete search history.

(56) References Cited

U.S. PATENT DOCUMENTS

2007/0296003 A1    12/2007  Park et al.
2021/0359138 A1*   11/2021  Bai ................... H01L 29/78696

FOREIGN PATENT DOCUMENTS

| CN | 207925481 U | 9/2018 | |
|----|-------------|--------|---|
| CN | 109300915 A | 2/2019 | |
| CN | 113097295 A | 7/2021 | |
| JP | 2002050633 A | 2/2002 | |
| JP | 2002190479 A | 7/2002 | |
| WO | WO2019/165824 * | 6/2019 | ....... H01L 20/78621 |

OTHER PUBLICATIONS

Written Opinion issued in International application PCT/CN2021/135599, mailed on Aug. 1, 2022, with English translation.
Chinese Office Action issued in corresponding Chinese Patent Application No. 202111367137.7 dated Jan. 18, 2023, with English translation.

* cited by examiner

OXIDE THIN FILM TRANSISTOR, DISPLAY PANEL AND PREPARATION METHOD THEREOF

TECHNICAL FIELD

The present application relates to a technical field of display, and in particular, to an oxide thin film transistor, a display panel, and a preparation method thereof.

BACKGROUND

Thin film transistor (TFT) is an important part of a flat panel display device, which can be provided on a glass substrate or a plastic substrate and is usually used as a switching device and a driving device in a driving circuit of a display panel. In order to improve product image quality and reduce product power consumption, designers integrate a low-temperature polysilicon (LTPS) thin film transistor and a metal oxide thin film transistor on a same driving circuit layer, which can combine the advantages of high mobility and fast charging speed for pixel capacitors of a low-temperature polysilicon thin film transistor, and low leakage current of a metal oxide thin film transistor.

A metal oxide semiconductor layer without special treatment has a large square resistance, which affects resistances of source and drain regions, thus affecting the mobility. In order to reduce block resistance of a metal oxide, source and drain regions are usually treated. For example, boron ion doping is used to reduce block resistance of source and drain regions, so as to make them conductive. Boron ions will diffuse from source and drain regions to a channel region, resulting in shortening of an actual channel region, which will seriously affect the threshold voltage of a device, and thus affecting a preparation process. As shown in FIGS. 1 and 2, a metal oxide thin film transistor 10 comprises a second gate 11, a first sub-buffer layer 12-1, a second sub-buffer layer 12-2, a metal oxide semiconductor layer, a gate insulating layer 14, a first gate 15, a first inter-sub-layer insulating layer 16-1, a second inter-sub-layer insulating layer 16-2, a source 17, and a drain 18. A metal oxide semiconductor layer comprises a source doped region 13-1, a drain doped region 13-3, and a channel region 13-2. In a top view of a channel region 13-2 in FIG. 2, the first gate 15 is located at an intermediate position of the second gate 11. As boron ions will diffuse from the source doped region 13-1 and the drain doped region 13-3 to the channel region 13-2, a first diffusion region 13-4 is generated between the source doped region 13-1 and the channel region 13-2, and a second diffusion region 13-5 is generated between the drain doped region 13-3 and the channel region 13-2. Assuming that length of a channel 13-2 is originally designed as L and its diffusion length is ΔL, then length of the remaining actual channel 13-2 becomes (L-2ΔL).

Therefore, it is necessary to design a new oxide thin film transistor, a display panel and a preparation method thereof, so as to solve the above technical problems that a gate insulating layer is patterned by using a gate self-alignment method, and then source and drain regions are doped with conductive ions to reduce its block resistance and make them conductive, and the doped conductive ions will diffuse along source/drain regions to a channel region, resulting in shortening of an actual channel region, which will seriously affect the threshold voltage of a device and stability of an electrical signal of a driving circuit layer.

Technical Problem

An embodiment of the present application provides an oxide thin film transistor, a display panel and a preparation method thereof, which can solve a problem that source and drain regions of a metal oxide thin film transistor in a existing driving circuit layer is doped with conductive ions, which will diffuse to along source and drain regions to a channel region, resulting in shortening of an actual channel region, which will seriously affect the threshold voltage of a device.

Technical Solution

To solve the above problems, the present application provides technical solutions as follows: An embodiment of the present application provide an oxide thin film transistor, comprising a substrate, a first active layer on the substrate, a first gate insulating layer disposed on one side of the first active layer away from the substrate, a first gate disposed on one side of the first gate insulating layer away from the substrate, a first interlayer insulating layer disposed on one side of the first gate away from the substrate, and a source/drain layer disposed on one side of the first interlayer insulating layer away from the substrate, wherein the source/drain layer comprises a first source and a first drain;

the first active layer comprises a first source doped region, a first channel region, a first drain doped region, a first diffusion region between the first source doped region and the first channel region, and a second diffusion region between the first drain doped region and the first channel region; wherein the first source is electrically connected to the first source doped region, and the first drain is electrically connected to the first drain doped region;

each thickness of the first gate insulating layer corresponding to the first source doped region, the first drain doped region, the first diffusion region, and the second diffusion region is less than a thickness corresponding to the first channel region; and thicknesses of the first gate insulating layer corresponding to the first diffusion region and the second diffusion region are both different from a thickness corresponding to the first source doped region and the first drain doped region.

According to a preferred embodiment of the present application, both of thicknesses of the first gate insulating layer corresponding to the first diffusion region and the second diffusion region are greater than a thickness corresponding to the first source doped region and the first drain doped region.

According to a preferred embodiment of the present application, the first active layer is doped with a conductive particle;

both of doping concentrations of the conductive particle in the first source doped region and the first drain doped region are greater than doping concentrations of the conductive particle in the first diffusion region and the second diffusion region; and both of doping concentrations of the conductive particle in the first diffusion region and the second diffusion region are greater than doping concentration of the conductive particle in the first channel region.

According to a preferred embodiment of the present application, the first gate insulating layer is provided with a first step corresponding to the first source doped region and the first drain doped region, the first gate insulating layer is provided with a second step corresponding to the first diffusion region and the second diffusion region, and one side of the second step close to the first channel region is flush with one side of the first gate.

According to a preferred embodiment of the present application, both of the first source doped region and the first drain doped region are doped with boron ions, wherein a concentration of the boron ions ranges from $1\times10^{12}$ ions/cm$^2$ to $1\times10^{14}$ ions/cm$^2$.

According to a preferred embodiment of the present application, a height of the second step is greater than a height of the first step.

According to a preferred embodiment of the present application, the conductive particle comprises one of boron ions, nitrogen ions or phosphorus ions.

According to the oxide thin film transistor in the above embodiments, an embodiment of the present application further provides a display panel comprising:
- a substrate;
- a driving circuit layer disposed on one side of a substrate, and the driving circuit layer comprises a first active layer, a first gate insulating layer disposed on one side of the first active layer away from the substrate, a first gate disposed on one side of the first gate insulating layer away from the substrate, a first interlayer insulating layer disposed on one side of the first gate away from the substrate, and a source/drain layer disposed on one side of the first interlayer insulating layer away from the substrate, wherein the source/drain layer comprises a first source and a first drain;
- wherein the first active layer comprises a first source doped region, a first channel region, a first drain doped region, a first diffusion region between the first source doped region and the first channel region, and a second diffusion region between the first drain doped region and the first channel region; wherein the first source is electrically connected to the first source doped region, and the first drain is electrically connected to the first drain doped region;
- each thickness of the first gate insulating layer corresponding to the first source doped region, the first drain doped region, the first diffusion region, and the second diffusion region is less than a thickness corresponding to the first channel region; and
- thicknesses of the first gate insulating layer corresponding to the first diffusion region and the second diffusion region are both different from a thickness corresponding to the first source doped region and the first drain doped region.

According to a preferred embodiment of the present application, both of thicknesses of the first gate insulating layer corresponding to the first diffusion region and the second diffusion region are greater than thicknesses of the first source doped region and the first drain doped region corresponding to the first gate insulating layer.

According to a preferred embodiment of the present application, the first active layer is doped with a conductive particle;
- both of doping concentrations of the conductive particle in the first source doped region and the first drain doped region are greater than that doping concentrations of the conductive particle in the first diffusion region and the second diffusion region; and
- both of doping concentrations of the conductive particle in the first diffusion region and the second diffusion region are greater than doping concentration of the conductive particle in the first channel region.

According to a preferred embodiment of the present application, the first gate insulating layer is provided with a first step corresponding to the first source doped region and the first drain doped region, the first gate insulating layer is provided with a second step corresponding to the first diffusion region and the second diffusion region, and one side of the second step close to the first channel region is flush with one side of the first gate.

According to a preferred embodiment of the present application, the drive circuit layer comprises a second gate between the substrate and the first active layer.

According to a preferred embodiment of the present application, the drive circuit layer further comprises at least a second active layer, a third gate, a fourth gate, a second source and a second drain disposed above the substrate, the second gate and the fourth gate are disposed in a same layer, and the first source, the first drain, the second source and the second drain are disposed in a same layer.

According to a preferred embodiment of the present application, the first active layer is a metal oxide semiconductor layer, and the second active layer is a low-temperature polysilicon semiconductor layer.

According to a preferred embodiment of the present application, the driving circuit layer further comprises a light shielding electrode layer, the light shielding electrode layer covers the first active layer, and the light shielding electrode layer is electrically connected to the second source.

According to a preferred embodiment of the present application, the conductive particle comprises one of boron ions, nitrogen ions, or phosphorus ions.

According to a preferred embodiment of the present application, the light shielding electrode layer comprises one of molybdenum, copper, chromium, tungsten, tantalum, or titanium.

According to the display panel in the above embodiments, the present application further provides a method for preparing a display panel, wherein the method comprises:
- step S1: providing a substrate, and forming at least a first active layer, a first gate insulating layer, a first gate layer, and a photoresist layer on the substrate; wherein the first active layer comprises a first source doped region, a first channel region, a first drain doped region, a first diffusion region between the first source doped region and the first channel region, and a second diffusion region between the first drain doped region and the first channel region;
- step S2: patterning the photoresist layer to form a first photoresist pattern that does not block the first source doped region and the first drain doped region of the first active layer;
- step S3: etching the first gate layer and the first gate insulating layer by using the first photoresist pattern as a barrier layer, so that both thicknesses of the first gate insulating layer corresponding to the first source doped region and the first drain doped region are smaller than a thickness corresponding to the first diffusion region, the second diffusion region, and the first channel region; and simultaneously doping a conductive particle from the first gate insulating layer to the first source doped region and the first drain doped region;
- step S4: patterning the first photoresist pattern to form a second photoresist pattern, etching a first quasi-gate and the first gate insulating layer by using the first photoresist pattern as a barrier layer again, so that each thickness of the first gate insulating layer corresponding to the first diffusion region and the second diffusion region is less than a thicknesses corresponding to the first channel region; and stripping the second photoresist pattern; and step S5: forming an interlayer insulating layer on the first gate insulating layer, and forming a first source and a first drain on the interlayer insulating layer, wherein the first source and the first drain are electrically connected to the first source doped region and the first drain doped region through a source contact hole and a drain contact hole, respectively.

According to a preferred embodiment of the present application, the conductive particle in the step S3 comprises one of boron ions, nitrogen ions, or phosphorus ions.

According to a preferred embodiment of the present application, both of doping concentrations of the conductive particle in the first source doped region and the first drain doped region are greater than that doping concentrations of the conductive particle in the first diffusion region and the second diffusion region; and both of doping concentrations of the conductive particle in the first diffusion region and the second diffusion region are greater than doping concentration of the conductive particle in the first channel region.

Technical Effects

An embodiment of the present application provide an oxide thin film transistor, a display panel, and a preparation method thereof. The first active layer comprises a first source doped region, a first channel region, a first drain doped region, a first diffusion region between the first source doped region and the first channel region, and a second diffusion region between the first drain doped region and the first channel region. Each thickness of the first gate insulating layer corresponding to the first source doped region, the first drain doped region, the first diffusion region, and the second diffusion region is less than a thickness corresponding to the first channel region; and thicknesses of the first gate insulating layer corresponding to the first diffusion region and the second diffusion region are both different from a thickness corresponding to the first source doped region and the first drain doped region, so that the first gate insulating layer effectively shields the first channel region laterally, and a distance for lateral diffusion of conductive ions along the channel region is reserved, which can effectively prevent the channel region from being shortened, ensure that the channel region has an effective length, and prevent threshold voltage from drifting.

BRIEF DESCRIPTION OF THE DRAWINGS

In order to more clearly describe the technical solutions in the embodiments or the prior art, hereinafter, the appended drawings used for describing the embodiments or the prior art will be briefly introduced. Apparently, the appended drawings described below are only directed to some embodiments of the present application, and for a person skilled in the art, without expenditure of creative labor, other drawings can be derived on the basis of these appended drawings.

DETAILED DESCRIPTION

Hereinafter, technical solution in embodiments of the present application will be clearly and completely described with reference to the accompanying drawings in embodiments of the present application. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

Indium gallium zinc oxide (IGZO), indium tin zinc oxide (ITZO), etc. can be used as an active layer material of a thin film transistor. Compared with an amorphous silicon thin film transistor, carrier concentration of an oxide thin film transistor is about ten times that of an amorphous silicon thin film transistor, and carrier mobility of an oxide thin film transistor is 20-30 times that of an amorphous silicon thin film transistor. Therefore, an oxide thin film transistor can greatly improve charge-discharge rate of a thin film transistor to a pixel electrode, improve response rate of a pixel, and further achieve a faster refresh rate. An oxide thin film transistor can meet the requirements of applications that require a fast response and a relative large current, such as high-frequency, high-resolution, large-size displays and organic light-emitting displays. However, after doping with conductive particles in a doped region of metal oxide thin film transistors prepared by an existing technology, conductive particles will diffuse along source and drain doped regions to a channel region, resulting in shortening of an actual channel region length, which will seriously affect the threshold voltage of a device. This embodiment can solve this problem.

Figure 1:
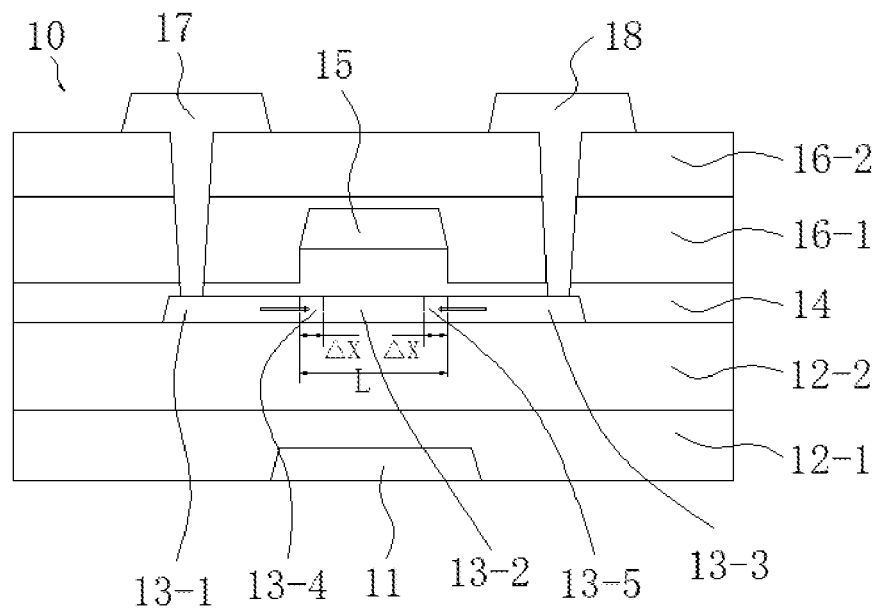
FIG. 1 is a schematic structural diagram of an oxide thin film transistor according to the prior art.
Figure 2:
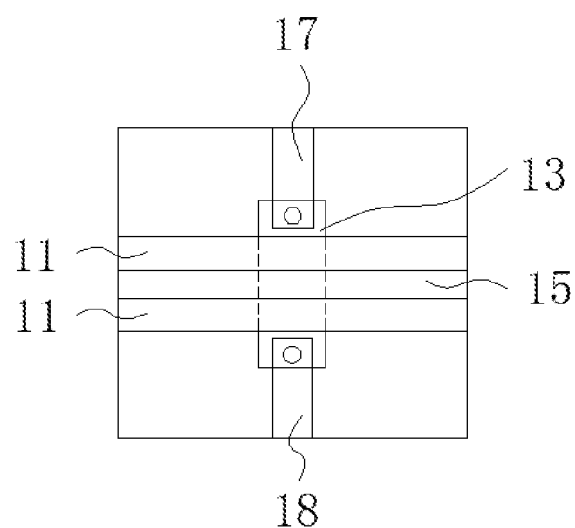
FIG. 2 is a schematic top view of a channel region of an oxide thin film transistor according to the prior art.
Figure 3:
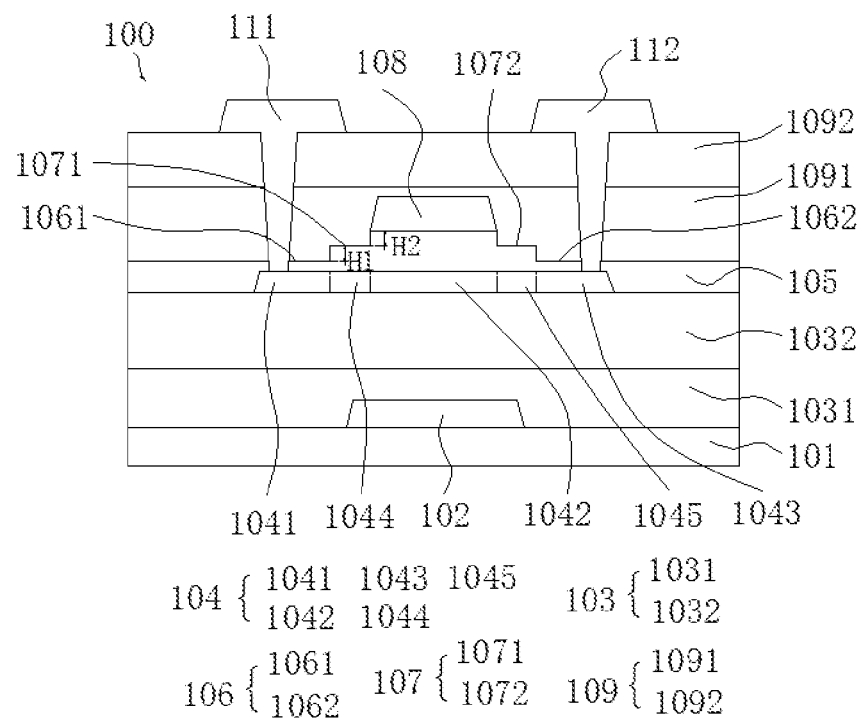
FIG. 3 is a schematic structural diagram of an oxide thin film transistor according to an embodiment of the present application.

As shown in FIG. 3, an embodiment of the present application provides a schematic structural diagram of an oxide thin film transistor 100 comprising a substrate 101, a second gate 102 on the substrate 101, a buffer layer 103 on the second gate 102, a first active layer 104 on the buffer layer 103, a first gate insulating layer 105 on the buffer layer 103 and covering the first active layer 104, a first gate 108 on the first gate insulating layer 105, an interlayer insulating layer 109 on the first gate insulating layer 105 and covering the first gate 108, a first source 111 and a first drain 112 on the interlayer insulating layer 109. The first active layer 104 comprises a first source doped region 1041, a first channel region 1042, a first drain doped region 1043, a first diffusion region 1044 between the first source doped region 1041 and the first channel region 1042, and a second diffusion region 1045 between the first drain doped region 1043 and the first channel region 1042. The first source 111 is electrically connected to the first source doped region 1041, and the first drain 112 is electrically connected to the first drain doped region 1043.

A material of the first active layer 104 is preferably selected from the group consisting of indium gallium zinc oxide, indium zinc oxide, gallium zinc oxide, and any combination thereof. The substrate 101 comprises a first transparent polyimide film, a first water-blocking layer, a second transparent polyimide film, and a second water-blocking layer which are stacked. The buffer layer 103 comprises a first silicon nitride layer 1031 and a second silicon oxide layer 1032. The interlayer insulating layer 109 comprises a silicon oxide layer 1091 and a silicon nitride layer 1092.

Each thickness of the first gate insulating layer 105 corresponding to the first source doped region 1041, the first drain doped region 1043, the first diffusion region 1044, and the second diffusion region 1045 is less than a thickness corresponding to the first channel region 1042. Thicknesses of the first gate insulating layer 105 corresponding to the first diffusion region 1044 and the second diffusion region 1045 are both different from a thickness corresponding to the first source doped region 1041 and the first drain doped region 1043. Specifically, both of thicknesses of the first gate insulating layer 105 corresponding to the first diffusion region 1044 and the second diffusion region 1045 are greater than a thickness corresponding to the first source doped region 1041 and the first drain doped region 1043. In this embodiment, by changing thickness of the first gate insulating layer 105 on the first active layer 104, the first channel region 1042 can be effectively shielded laterally, and a distance for lateral diffusion of conductive ions along the channel region is reserved, which can effectively prevent the channel region from being shortened, ensure that the channel region has an effective length, and prevent threshold voltage from drifting.

The first active layer 104 is doped with a conductive particle. Both of doping concentrations of the conductive particle in the first source doped region 1041 and the first drain doped region 1043 are greater than doping concentrations of the conductive particle in the first diffusion region 1044 and the second diffusion region 1045; and both of doping concentrations of the conductive particle in the first diffusion region 1044 and the second diffusion region 1045 are greater than doping concentration of the conductive particle in the first channel region 1042. The conductive particle comprises one of boron ions, nitrogen ions or phosphorus ions.

The first gate insulating layer 105 is provided with a first step 106 corresponding to the first source doped region 1041 and the first drain doped region 1043. The first gate insulating layer 105 is provided with a second step 107 corresponding to the first diffusion region 1044 and the second diffusion region 1045. One side of the second step 107 close to the first channel region 1042 is flush with one side of the first gate 108. A height H2 of the second step 107 is greater than a height H1 of the first step 106. Specifically, the first gate insulating layer 105 is provided with a left first step 1061 corresponding to the first source doped region 1041, the first gate insulating layer 105 is provided with a right first step 1062 corresponding to the first drain doped region 1043, and the left first step 1061 and the right first step 1062 form the first step 106. The first gate insulating layer 105 is provided with a left second step 1071 corresponding to the first diffusion region 1044, the first gate insulating layer 105 is provided with a right second step 1072 corresponding to the second diffusion region 1045, and both of opposite sides of the right second step 1072 and the left second step 1071 are flush with one side of the first gate 108. A length of the left second step 1071 is greater than or equal to a length of the first diffusion region 1044, a length of the right second step 1072 is greater than or equal to a length of the second diffusion region 1045, and the left second step 1071 and the right second step 1072 form a second step 107.

Figure 4:
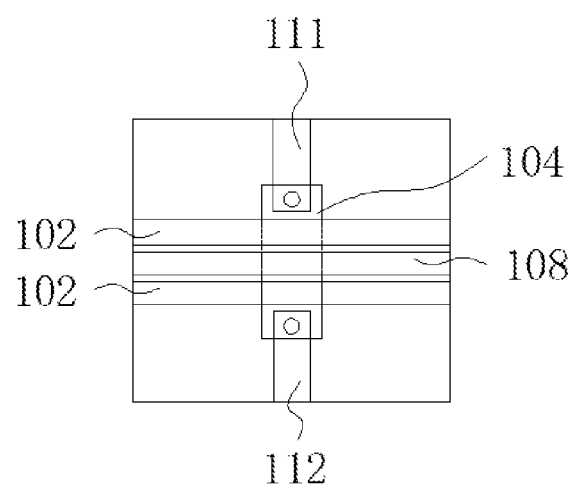
FIG. 4 is a schematic top view of a channel region of an oxide thin film transistor according to an embodiment of the present application.

As shown in FIG. 4, an embodiment of the present application provides a schematic top view of a channel region of an oxide thin film transistor 100. In the schematic top view of the channel region, the first gate 108 is located directly above the first active layer 104, and the first gate 108 is located in the middle of the second gate 102. The first gate 108 overlaps with the first channel region 1042. The first source 111 is electrically connected to the first source doped region 1041 through a source contact hole, and the first drain electrode 112 is electrically connected to the first drain doped region 1043 through a drain contact hole.

Figure 5:
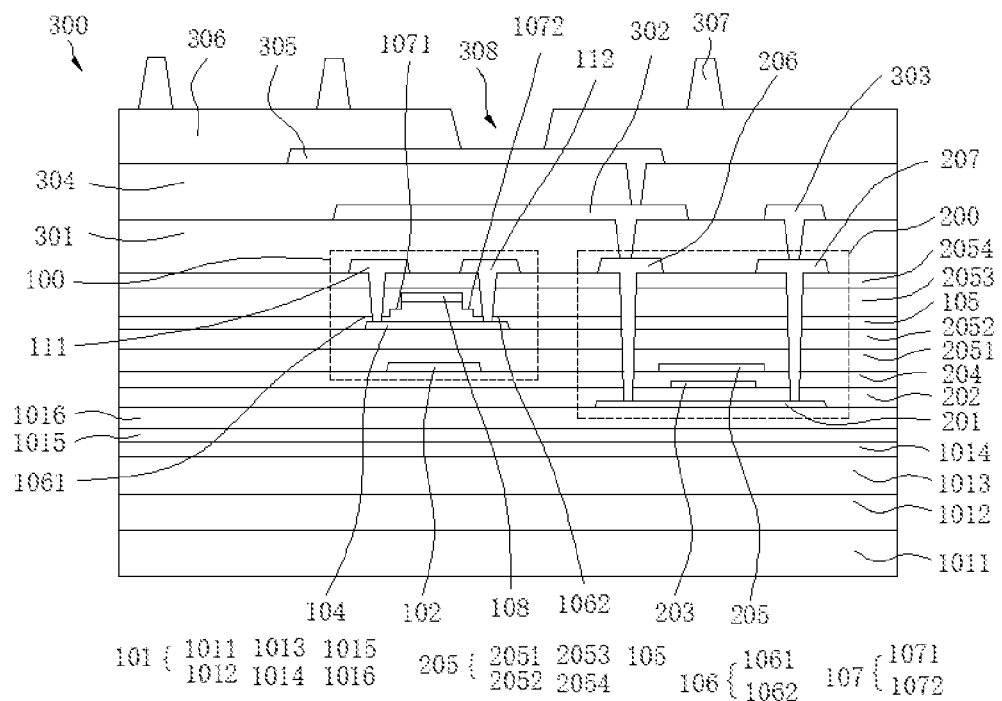
FIG. 5 is a schematic structural diagram of a display panel according to an embodiment of the present application.

As shown in FIG. 5, according to the oxide thin film transistor 100 in the above-described embodiments, the present application further provides a display panel 300. The applicant fabricated the oxide thin film transistor 100 and the low-temperature polysilicon thin film transistor 200 at the same time on a same driving circuit layer of the display panel 300. In particular, structure of the oxide thin film transistor 100 is the same as that in FIG. 3. The oxide thin film transistor 100 and the low-temperature polysilicon thin film transistor 200 have a plurality of film layers arranged in a same layer, and the reference numerals herein overlap. The display panel 300 comprises a substrate 101 and a driving circuit layer on one side of the substrate 101.

Combining FIG. 5 and FIG. 3, the driving circuit layer comprises a first active layer 104, a first gate insulating layer 105 disposed on one side of the first active layer 104 away from the substrate 101, a first gate 108 disposed on one side of the first gate insulating layer 105 away from the substrate 101, a first interlayer insulating layer disposed on one side of the first gate 108 away from the substrate 301, and a source/drain layer disposed on one side of the first interlayer insulating layer away from the substrate, wherein the source/drain layer comprises a first source 111 and a first drain 112. The first active layer 104 comprises a first source doped region 1041, a first channel region 1042, a first drain doped region 1043, a first diffusion region 1044 between the first source doped region 1041 and the first channel region 1042, and a second diffusion region 1045 between the first drain doped region 1043 and the first channel region 1042, wherein the first source 111 is electrically connected to the first source doped region 1041, and the first drain 112 is electrically connected to the first drain doped region 1043. Each thickness of the first gate insulating layer 105 corresponding to the first source doped region 1041, the first drain doped region 1043, the first diffusion region 1044, and the second diffusion region 1045 is less than a thickness corresponding to the first channel region 1042. Thicknesses of the first gate insulating layer 105 corresponding to the first diffusion region 1044 and the second diffusion region 1045 are both different from a thickness corresponding to the first source doped region 1041 and the first drain doped region 1043. Both of thicknesses of the first gate insulating layer 105 corresponding to the first diffusion region 1044 and the second diffusion region 1045 is greater than thicknesses of the first source doped region 1041 and the first drain doped region 1043 corresponding to the first gate insulating layer 105. The first gate insulating layer 105 between the first gate 108 and the first active layer 104 comprises a first step 106 and a second step 107 above the first step 106. Specific structures of the first step 106 and the second step 107 are not described herein again. In this embodiment, by changing thickness of the first gate insulating layer 105 on the first active layer 104, the first channel region 1042 can be effectively shielded laterally, and a distance for lateral diffusion of conductive ions along the channel region is reserved, which can effectively prevent the channel region from being shortened, ensure that the channel region has an effective length, and prevent threshold voltage from drifting.

The first active layer 104 is doped with a conductive particle. Both of doping concentrations of the conductive particle in the first source doped region 1041 and the first drain doped region 1043 are greater than doping concentrations of the conductive particle in the first diffusion region 1044 and the second diffusion region 1045. Both of doping concentrations of the conductive particle in the first diffusion region 1044 and the second diffusion region 1045 are greater than doping concentration of the conductive particle in the first channel region 1042. The conductive particle comprises one of boron ions, nitrogen ions or phosphorus ions.

The driving circuit layer comprises a second gate 102 between the substrate 101 and the first active layer 104. The driving circuit layer further comprises at least a second active layer 201, a third gate 203, a fourth gate 205, a second source 206, and a second drain 207 disposed above the substrate 101, the second gate 102 and the fourth gate 205 are disposed in a same layer, and the first source 111, the first drain 112, the second source 206, and the second drain 207 are disposed in a same layer. The first active layer 104 is a metal oxide semiconductor layer, and the second active layer 201 is a low-temperature polysilicon semiconductor layer. The driving circuit layer further comprises a light shielding electrode layer 302, the light shielding electrode layer 302 covers the first active layer 102, and the light shielding electrode layer 102 is electrically connected to the second source 206. A material of the light shielding electrode layer 302 comprises one of molybdenum, copper, chromium, tungsten, tantalum, or titanium.

Specifically, substrate 101 in this embodiment comprises a first polyimide (PI) layer 1011, a first water-blocking layer 1012 on the first PI layer 1011, a second polyimide (PI) layer 1013 on the first water-blocking layer 1012, a second water-blocking layer 1014 on the second polyimide (PI) layer 1013, a silicon nitride layer 1015 on the second water-blocking layer 1014, and a silicon oxide layer 1016 on the silicon nitride layer 1015. A third gate insulating layer 202 covering the second active layer 201 is disposed on the silicon oxide layer 1016, and a fourth gate insulating layer 204 covering the third gate 203 is disposed on the third gate insulating layer 202. The third gate insulating layer 202 is a silicon oxide layer, and the fourth gate insulating layer 204 is a silicon nitride layer. The interlayer insulating layer 205 comprises a silicon nitride layer 2051, a silicon oxide layer 2052, a first gate insulating layer 105, a silicon oxide layer 2053, and a silicon nitride layer 2054. The interlayer insulating layer 205 is provided with a first planarization layer 301 of the first source electrode 111, a first drain 112, a second source 206, and a second drain 207, and the first planarization layer 301 is provided with a light shielding electrode layer 302 and an auxiliary electrode 303. A second planarization layer 304 is further provided above the light shielding electrode layer 302 and the auxiliary electrode 303. An anode 305 and a pixel definition layer 306 are provided on the second planarization layer 304. A pixel opening 308 is provided on the pixel definition layer 306 corresponding to the position of the anode 305, a light emitting device (not shown) is provided on the pixel opening 308, and spacers 307 are provided on both sides of the pixel definition layer 306 corresponding to the pixel opening 308. In this embodiment, the display panel 300 further comprises an encapsulation layer covering the light emitting device and a polarizing layer on the surface of the an encapsulation layer.

According to the display panel 300 in the above-described embodiment, the present application further provides a method for preparing a display panel, the display panel comprises a substrate and a drive circuit layer on one side of the substrate, wherein the method comprises:

step S1: providing a substrate, and forming at least a first active layer, a first gate insulating layer, a first gate layer, and a photoresist layer on the substrate; wherein the first active layer comprises a first source doped region, a first channel region, a first drain doped region, a first diffusion region between the first source doped region and the first channel region, and a second diffusion region between the first drain doped region and the first channel region;

step S2: patterning the photoresist layer to form a first photoresist pattern that does not block the first source doped region and the first drain doped region of the first active layer;

step S3: etching the first gate layer and the first gate insulating layer by using the first photoresist pattern as a barrier layer, so that both thicknesses of the first gate insulating layer corresponding to the first source doped region and the first drain doped region are smaller than a thickness corresponding to the first diffusion region, the second diffusion region, and the first channel region; and simultaneously doping a conductive particle from the first gate insulating layer to the first source doped region and the first drain doped region;

step S4: patterning the first photoresist pattern to form a second photoresist pattern, etching a first quasi-gate and the first gate insulating layer by using the first photoresist pattern as a barrier layer again, so that each thickness of the first gate insulating layer corresponding to the first diffusion region and the second diffusion region is less than a thicknesses corresponding to the first channel region; and stripping the second photoresist pattern; and step S5: forming an interlayer insulating layer on the first gate insulating layer, and forming a first source and a first drain on the interlayer insulating layer, wherein the first source and the first drain are electrically connected to the first source doped region and the first drain doped region through a source contact hole and a drain contact hole, respectively.

FIGS. 6-13 are schematic structural diagrams of a film layer preparation flow of an oxide thin film transistor in a display panel according to an embodiment of the present application. In particular, structure of the oxide thin film transistor 100 is the same as that in FIG. 5. The oxide thin film transistor 100 and the low-temperature polysilicon thin film transistor 200 have a plurality of film layers arranged in a same layer, and the reference numerals herein overlap. In this embodiment, the reference numerals are subjected to those in FIGS. 6-13.

Figure 6:
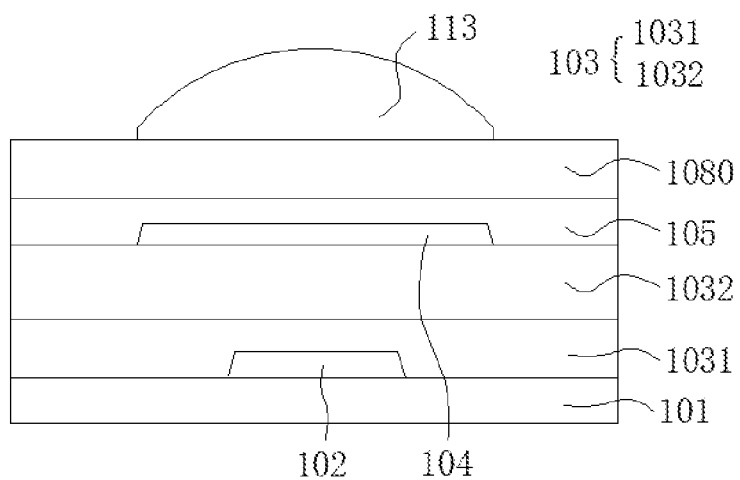
FIGS. 6-13 are schematic diagrams of a local structure in a preparation process flow of a display panel according to an embodiment of the present application.

As shown in FIG. 6, a substrate 101 is provided, a second gate 102 and a silicon nitride layer 1031 covering the second gate 102 are prepared on the substrate 101, a silicon oxide layer 1032 is prepared on the silicon nitride layer 1031, the silicon nitride layer 1031 and the silicon oxide layer 1032 form a buffer layer 103, a first active layer 104 and a first gate insulating layer 105 covering the first active layer 104 are prepared on the buffer layer 103, a second gate layer 1080 is prepared on the first gate insulating layer 105, and a photoresist layer 113 is prepared on the second gate layer 1080.

Figure 7:
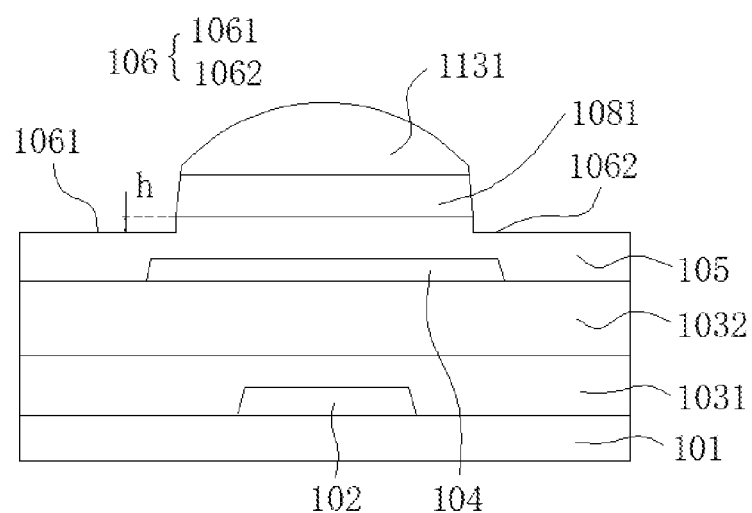
Figure 8:
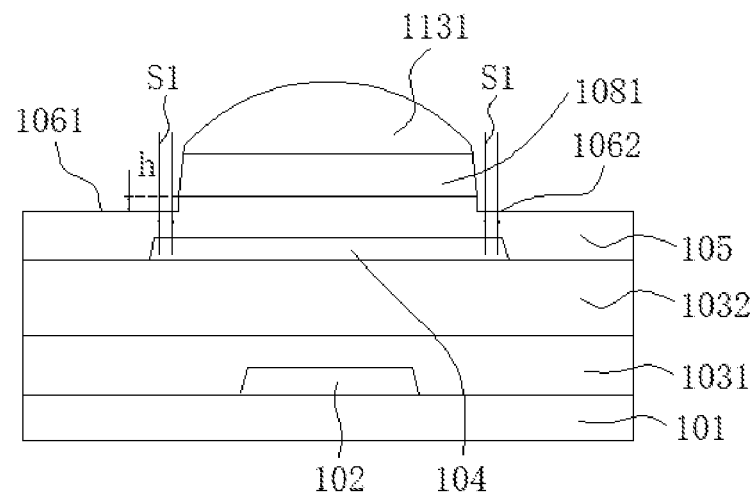

As shown in FIGS. 7 and 8, the first active layer 104 comprises a first source doped region 1041, a first channel region 1042, a first drain doped region 1043, a first diffusion region 1044 between the first source doped region 1041 and the first channel region 1042, and a second diffusion region 1045 between the first drain doped region 1043 and the first channel region 1042. The photoresist layer 113 is patterned to form a first photoresist pattern 1131 that does not block the first source doped region 1041 and the first drain doped region 1042 of the first active layer 104. The second gate layer 1080 and the first gate insulating layer 105 are etched by using the first photoresist pattern 1131 as a barrier layer to form a second quasi-gate 1081, a left first step 1061 above the first source doped region 1041, and a right first step 1062 above the first drain doped region 1043, and the left first step 1061 and the right first step 1062 form a step 106. Then the first photoresist pattern layer 1131, the second quasi-gate 1081 and the first step 106 are used as shielding layers, and a conductive particle is doped from the first gate insulating layer to the first source doped region 1041 and the first drain doped region 1043 simultaneously, wherein a concentration of the boron ions preferably ranges from $1\times10^{12}$ ions/cm$^2$ to $1\times10^{14}$ ions/cm$^2$. The conductive particle comprises one of boron ions, nitrogen ions or phosphorus ions. Both of doping concentrations of the conductive particle in the first source doped region 1041 and the first drain doped region 1043 are greater than that doping concentrations of the conductive particle in the first diffusion region 1044 and the second diffusion region 1045, and both of doping concentrations of the conductive particle in the first diffusion region 1044 and the second diffusion region 1045 are greater than doping concentration of the conductive particle in the first channel region 1042.

Figure 9:
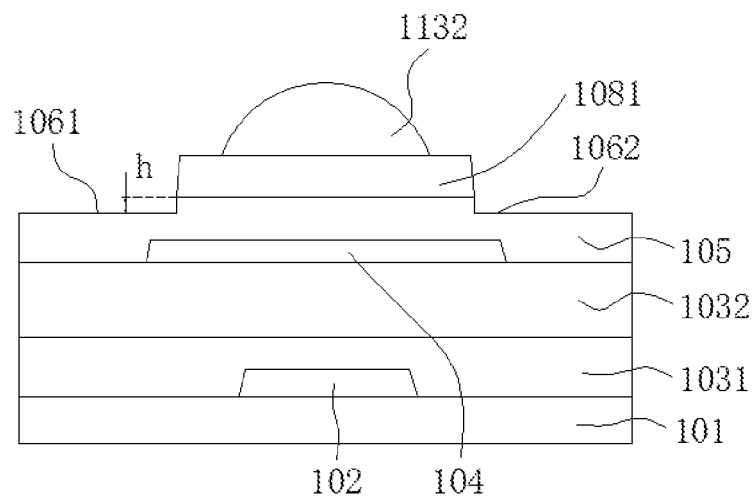
Figure 10:
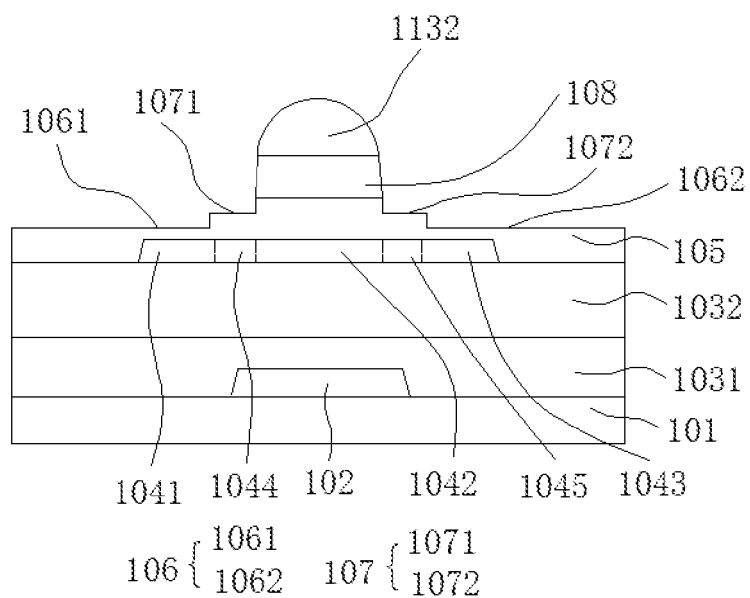
Figure 11:
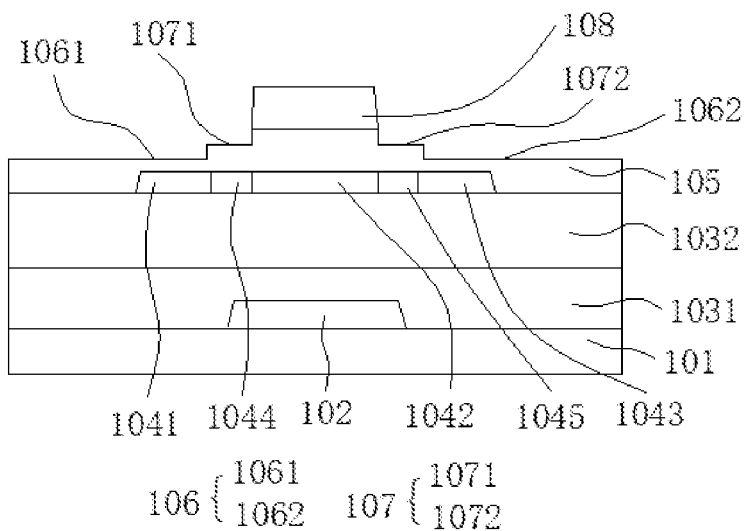

As shown in FIGS. 9, 10 and 11, the first photoresist pattern 1131 is patterned to form a second photoresist pattern 1132, and the second quasi-gate 1081 and the first gate insulating layer 105 are etched again by using the second photoresist pattern 1132 as a barrier layer to form a required first gate 108 and a second step 107 over the first diffusion region 1044 and the second diffusion region 1045, wherein the second step 107 comprises a left second step 1071 and a right second step 1072, and the second photoresist pattern 1132 is stripped.

Figure 12:
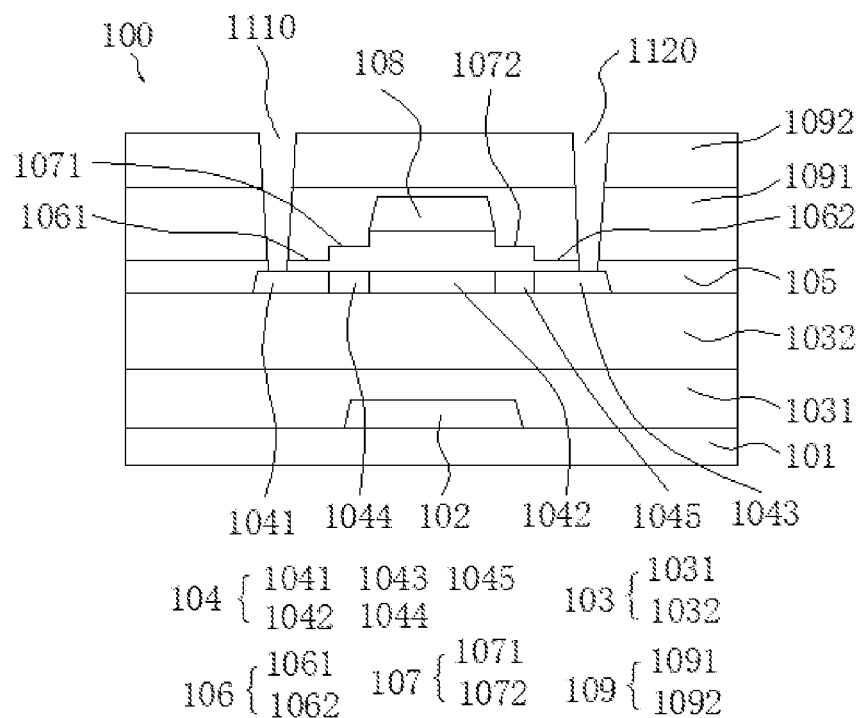
Figure 13:
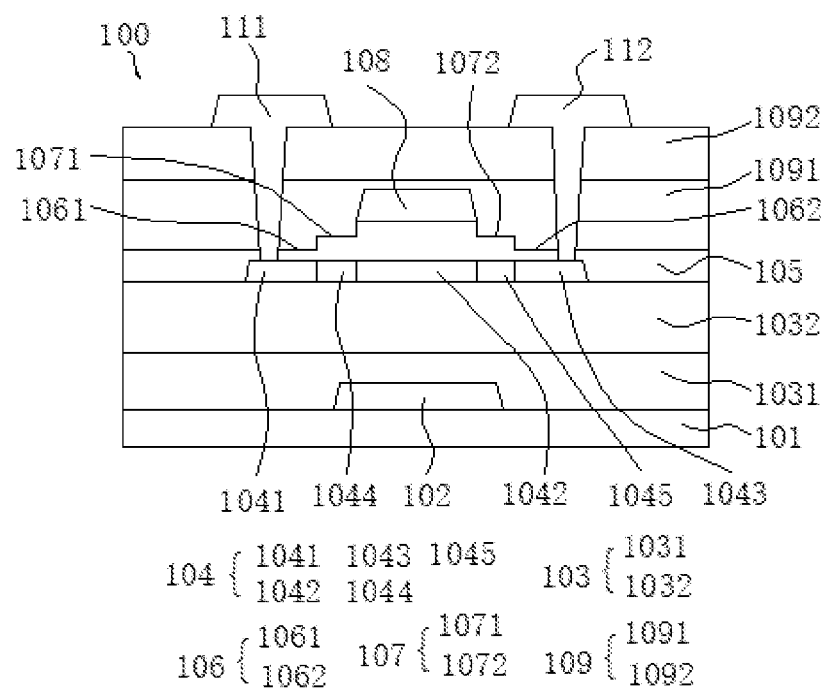

As shown in FIGS. 12 and 13, an interlayer insulating layer 109 is formed on the first gate insulating layer 105, the interlayer insulating layer 109 comprises a silicon oxide layer 1091 and a silicon nitride layer 1092, a source contact hole 1110 and a drain contact hole 1120 are etched on the interlayer insulating layer 109, a first source 111 and a first drain 112 are provided on the interlayer insulating layer 109, the first source 111 and the first drain 112 are electrically connected to the first source doped region 1141 and the first drain doped region 1143 through the source contact hole 1110 and the drain contact hole 1120, respectively, thereby completing the film layer preparation of the corresponding oxide thin film transistor 100 in the driving circuit layer.

In summary, although the present application has been disclosed as above preferred embodiments, the above preferred embodiments are not intended to limit the present application, and a skilled person in the art may make various modifications without departing from the spirit and scope of the present application. Therefore, the protection scope of the present application is subject to the scope defined by the claims.

What is claimed is:

1. An oxide thin film transistor, comprising a substrate, a first active layer on the substrate, a second gate between the substrate and the first active layer, a first gate insulating layer disposed on one side of the first active layer away from the substrate, a first gate disposed on one side of the first gate insulating layer away from the substrate, a first interlayer insulating layer disposed on one side of the first gate away from the substrate, and a source/drain layer disposed on one side of the first interlayer insulating layer away from the substrate, wherein the source/drain layer comprises a first source and a first drain;

the first active layer comprises a first source doped region, a first channel region, a first drain doped region, a first diffusion region between the first source doped region and the first channel region, and a second diffusion region between the first drain doped region and the first channel region; wherein the first source is electrically connected to the first source doped region, and the first drain is electrically connected to the first drain doped region;

each thickness of the first gate insulating layer corresponding to the first source doped region, the first drain doped region, the first diffusion region, and the second diffusion region is less than a thickness corresponding to the first channel region; and thicknesses of the first gate insulating layer corresponding to the first diffusion region and the second diffusion region are both different from a thickness corresponding to the first source doped region and the first drain doped region.

2. The oxide thin film transistor according to claim 1, wherein both of thicknesses of the first gate insulating layer corresponding to the first diffusion region and the second diffusion region are greater than a thickness corresponding to the first source doped region and the first drain doped region.

3. The oxide thin film transistor according to claim 1, wherein the first gate insulating layer is provided with a first step corresponding to the first source doped region and the first drain doped region, the first gate insulating layer is provided with a second step corresponding to the first diffusion region and the second diffusion region, and one side of the second step close to the first channel region is flush with one side of the first gate.

4. The oxide thin film transistor according to claim 3, wherein a height of the second step is greater than a height of the first step.

5. The oxide thin film transistor according to claim 1, wherein the first active layer is doped with a conductive particle;

both of doping concentrations of the conductive particle in the first source doped region and the first drain doped region are greater than doping concentrations of the conductive particle in the first diffusion region and the second diffusion region; and both of doping concentrations of the conductive particle in the first diffusion region and the second diffusion region are greater than doping concentration of the conductive particle in the first channel region.

6. The oxide thin film transistor according to claim 5, wherein both of the first source doped region and the first drain doped region are doped with boron ions, wherein a concentration of the boron ions ranges from $1\times10^{12}$ ions/cm$^2$ to $1\times10^{14}$ ions/cm$^2$.

7. The oxide thin film transistor according to claim 5, wherein the conductive particle comprises one of boron ions, nitrogen ions or phosphorus ions.

8. A display panel, comprising:
a substrate;
a driving circuit layer disposed on one side of a substrate, and the driving circuit layer comprises a first active layer, a first gate insulating layer disposed on one side of the first active layer away from the substrate, a first gate disposed on one side of the first gate insulating layer away from the substrate, a second gate between the substrate and the first active layer, a first interlayer insulating layer disposed on one side of the first gate away from the substrate, and a source/drain layer disposed on one side of the first interlayer insulating layer away from the substrate, wherein the source/drain layer comprises a first source and a first drain;

wherein the first active layer comprises a first source doped region, a first channel region, a first drain doped region, a first diffusion region between the first source doped region and the first channel region, and a second diffusion region between the first drain doped region and the first channel region; wherein the first source is electrically connected to the first source doped region, and the first drain is electrically connected to the first drain doped region;

each thickness of the first gate insulating layer corresponding to the first source doped region, the first drain doped region, the first diffusion region, and the second diffusion region is less than a thickness corresponding to the first channel region; and thicknesses of the first gate insulating layer corresponding to the first diffusion region and the second diffusion region are both different from a thickness corresponding to the first source doped region and the first drain doped region.

9. The display panel according to claim 8, wherein both of thicknesses of the first gate insulating layer corresponding to the first diffusion region and the second diffusion region are greater than thicknesses of the first source doped region and the first drain doped region corresponding to the first gate insulating layer.

10. The display panel according to claim 8, wherein the first gate insulating layer is provided with a first step corresponding to the first source doped region and the first drain doped region, the first gate insulating layer is provided with a second step corresponding to the first diffusion region and the second diffusion region, and one side of the second step close to the first channel region is flush with one side of the first gate.

11. The display panel according to claim 8, wherein the first active layer is doped with a conductive particle;

both of doping concentrations of the conductive particle in the first source doped region and the first drain doped region are greater than that doping concentrations of the conductive particle in the first diffusion region and the second diffusion region; and both of doping concentrations of the conductive particle in the first diffusion region and the second diffusion region are greater than doping concentration of the conductive particle in the first channel region.

12. The display panel according to claim 11, wherein the conductive particle comprises one of boron ions, nitrogen ions, or phosphorus ions.

13. The display panel according to claim 8, wherein the drive circuit layer further comprises at least a second active layer, a third gate, a fourth gate, a second source and a second drain disposed above the substrate, the second gate and the fourth gate are disposed in a same layer, and the first source, the first drain, the second source and the second drain are disposed in a same layer.

14. The display panel according to claim 13, wherein the first active layer is a metal oxide semiconductor layer, and the second active layer is a low-temperature polysilicon semiconductor layer.

15. The display panel according to claim 13, wherein the driving circuit layer further comprises a light shielding electrode layer, the light shielding electrode layer covers the first active layer, and the light shielding electrode layer is electrically connected to the second source.

16. The display panel according to claim 15, wherein the light shielding electrode layer comprises one of molybdenum, copper, chromium, tungsten, tantalum, or titanium.

17. A method for preparing a display panel, the display panel comprises a substrate and a drive circuit layer on one side of the substrate, wherein the method comprises:

step S1: providing a substrate, and forming at least a first active layer, a first gate insulating layer, a first gate layer, and a photoresist layer on the substrate; wherein the first active layer comprises a first source doped region, a first channel region, a first drain doped region, a first diffusion region between the first source doped region and the first channel region, and a second diffusion region between the first drain doped region and the first channel region;

step S2: patterning the photoresist layer to form a first photoresist pattern that does not block the first source doped region and the first drain doped region of the first active layer;

step S3: etching the first gate layer and the first gate insulating layer by using the first photoresist pattern as a barrier layer, so that both thicknesses of the first gate insulating layer corresponding to the first source doped region and the first drain doped region are smaller than a thickness corresponding to the first diffusion region, the second diffusion region, and the first channel region; and simultaneously doping a conductive particle from the first gate insulating layer to the first source doped region and the first drain doped region;

step S4: patterning the first photoresist pattern to form a second photoresist pattern, etching the first gate layer and the first gate insulating layer by using the first photoresist pattern as a barrier layer again, so that each thickness of the first gate insulating layer corresponding to the first diffusion region and the second diffusion region is less than a thicknesses corresponding to the first channel region; and stripping the second photoresist pattern; and step S5: forming an interlayer insulating layer on the first gate insulating layer, and forming a first source and a first drain on the interlayer insulating layer, wherein the first source and the first drain are electrically connected to the first source doped region and the first drain doped region through a source contact hole and a drain contact hole, respectively.

18. The method according to claim 17, wherein the conductive particle in the step S3 comprises one of boron ions, nitrogen ions, or phosphorus ions.

19. The method according to claim 18, wherein both of doping concentrations of the conductive particle in the first source doped region and the first drain doped region are greater than that doping concentrations of the conductive particle in the first diffusion region and the second diffusion region; and both of doping concentrations of the conductive particle in the first diffusion region and the second diffusion region are greater than doping concentration of the conductive particle in the first channel region.

* * * * *